(12) United States Patent
Wada

(10) Patent No.: US 8,009,273 B2
(45) Date of Patent: Aug. 30, 2011

(54) EXPOSURE APPARATUS AND DEVICE MANUFACTURING METHOD

(75) Inventor: Hiroyuki Wada, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 419 days.

(21) Appl. No.: 12/245,207

(22) Filed: Oct. 3, 2008

(65) Prior Publication Data
US 2009/0091733 A1    Apr. 9, 2009

(30) Foreign Application Priority Data
Oct. 5, 2007    (JP) .................... 2007-262730

(51) Int. Cl.
*G03B 27/42*    (2006.01)
(52) U.S. Cl. ......................................... 355/53
(58) Field of Classification Search ............ 355/53, 355/72–76; 250/548
See application file for complete search history.

(56) References Cited

U.S. PATENT DOCUMENTS

| | | | | |
|---|---|---|---|---|
| 6,493,062 B2 * | 12/2002 | Tokuda et al. | ............. | 355/53 |
| 6,741,328 B2 * | 5/2004 | Yonekawa et al. | ............. | 355/53 |
| 6,853,443 B2 * | 2/2005 | Nishi | ............. | 355/72 |
| 6,885,431 B2 * | 4/2005 | Hara | ............. | 355/53 |

FOREIGN PATENT DOCUMENTS

JP    11-297587 A    10/1999

* cited by examiner

*Primary Examiner* — Hung Henry Nguyen
(74) *Attorney, Agent, or Firm* — Canon U.S.A., Inc. IP Division

(57) ABSTRACT

This invention provides an exposure apparatus configured to expose a pattern of an original on a substrate through a projection optical system. The apparatus comprises a holding unit configured to hold the projection optical system, at least three anti-vibration mounts configured to support the holding unit, and at least three supporting members configured to support the at least three anti-vibration mounts respectively. The at least three supporting members are independent of each other without connecting to each other.

12 Claims, 4 Drawing Sheets

FIG. 3B -- PRIOR ART --

-- PRIOR ART --

EXPOSURE APPARATUS AND DEVICE MANUFACTURING METHOD

BACKGROUND OF THE INVENTION

1. Field of the Invention

The present invention relates to an exposure apparatus and device manufacturing method.

2. Description of the Related Art

In recent years, as the capacity of a semiconductor memory increases as well as the speed and integration density of a CPU processor, a demand for a decrease in feature size of a resist pattern formed on a wafer increases, which requires a high exposure accuracy. Also, a high throughput is needed inevitably. Therefore, improvements in exposure accuracy and throughput have been achieved by increasing the resolution through an increase in numerical aperture (NA) of projection optical systems, an improvement in position controllability, or an increase in acceleration speed of a substrate stage or original state, and the like.

When driving the stage of the exposure apparatus, an inertia reaction force occurs upon acceleration/deceleration. When the reaction force is transmitted from the floor or an exposure apparatus main body to a surface plate on which a projection optical system and measurement system are placed, the surface plate may swing or vibrate. This excites natural vibration of the mechanism of the exposure apparatus which may then become high-frequency vibration that interferes with high-speed, high-accuracy positioning of the stage.

In order to solve problems related to the reaction force, a conventional exposure apparatus is provided with a structure that receives the reaction force. The reaction force generated upon driving of the stage is released to this structure. As a result, the vibration of the floor caused by the reaction force upon driving of the stage is reduced. Japanese Patent Laid-Open No. 11-297587 discloses this technique.

The above prior art can decrease the vibration of the floor, on which the exposure apparatus is installed, caused by the reaction force generated upon driving of the stage. If, however, a base frame which supports an anti-vibration mount has a natural frequency equal to that of the installation floor, it may amplify the floor vibration. Then, the entire exposure apparatus may be excited to interfere with high-speed, high-accuracy positioning of the stage. In other words, to decrease the influence of the vibration by a disturbance such as floor vibration, the base frame which supports the anti-vibration mount must have a natural frequency which is equal to or more than the natural frequency (e.g., 20 Hz to 40 Hz) of the floor.

When paying attention to the shape of the base frame (the supporting member of an anti-vibration mechanism) of a conventional example, a supporting member 3' of an anti-vibration mount is connected as shown in FIG. 4. Therefore, a vibration mode occurs in the connecting portion. The natural vibration of the connecting portion amplifies the vibration of the floor, thus interfering with high-speed, high-accuracy positioning of the stage.

In recent years, a stage apparatus is available which has two stages to increase the processing speed and throughput of an exposure apparatus. This enables an exposure process of projecting a pattern onto a substrate and exposing the projected pattern and an alignment process of aligning the substrate to be performed simultaneously.

As described above, as the stage size increases, the size of the main body structure must be increased to cope with it. The size of the main body structure, however, cannot be increased limitlessly because the occupied installation area may undesirably increase and because of the limitations on the withstand load of the building. When the stage size increases, the rigidity of the main body structure tends to decrease.

SUMMARY OF THE INVENTION

It is an object of the present invention to provide an exposure apparatus which can decrease the influence of vibration caused by a disturbance such as floor vibration without increasing the size of, for example, the apparatus, thus enabling high-speed, high-accuracy positioning.

According to the present invention, there is provided an exposure apparatus configured to expose a pattern of an original on a substrate through a projection optical system, the apparatus comprising:

a holding unit configured to hold the projection optical system;

at least three anti-vibration mounts configured to support the holding unit; and at least three supporting members configured to support the at least three anti-vibration mounts respectively, wherein the at least three supporting members are independent of each other without connecting to each other.

The present invention can provide an exposure apparatus which can reduce the influence of vibration caused by a disturbance such as floor vibration without increasing the size of the exposure apparatus, thus enabling high-speed, high-accuracy positioning.

Further features of the present invention will become apparent from the following description of exemplary embodiments with reference to the attached drawings.

BRIEF DESCRIPTION OF THE DRAWINGS

FIGS. 3A and 3B are views for explaining a supporting member for an anti-vibration mechanism in the present invention and a supporting member for a conventional anti-vibration mechanism, respectively.

DESCRIPTION OF THE EMBODIMENT

[Embodiment of Exposure Apparatus]

An embodiment of the present invention will be described hereinafter with reference to the accompanying drawings. The present invention is not limited to this embodiment. The respective arrangements may be replaced with alternatives as far as the object of the present invention is attained. This embodiment is directed to an exposure apparatus which transfers a pattern formed on an original onto a substrate through a projection optical system. The present invention may also be applied to an exposure apparatus which transfers a pattern on an original onto a semiconductor wafer as a substrate in a vacuum atmosphere, or an exposure apparatus which draws a pattern on a substrate with an electron beam without using an original.

Figure 1:
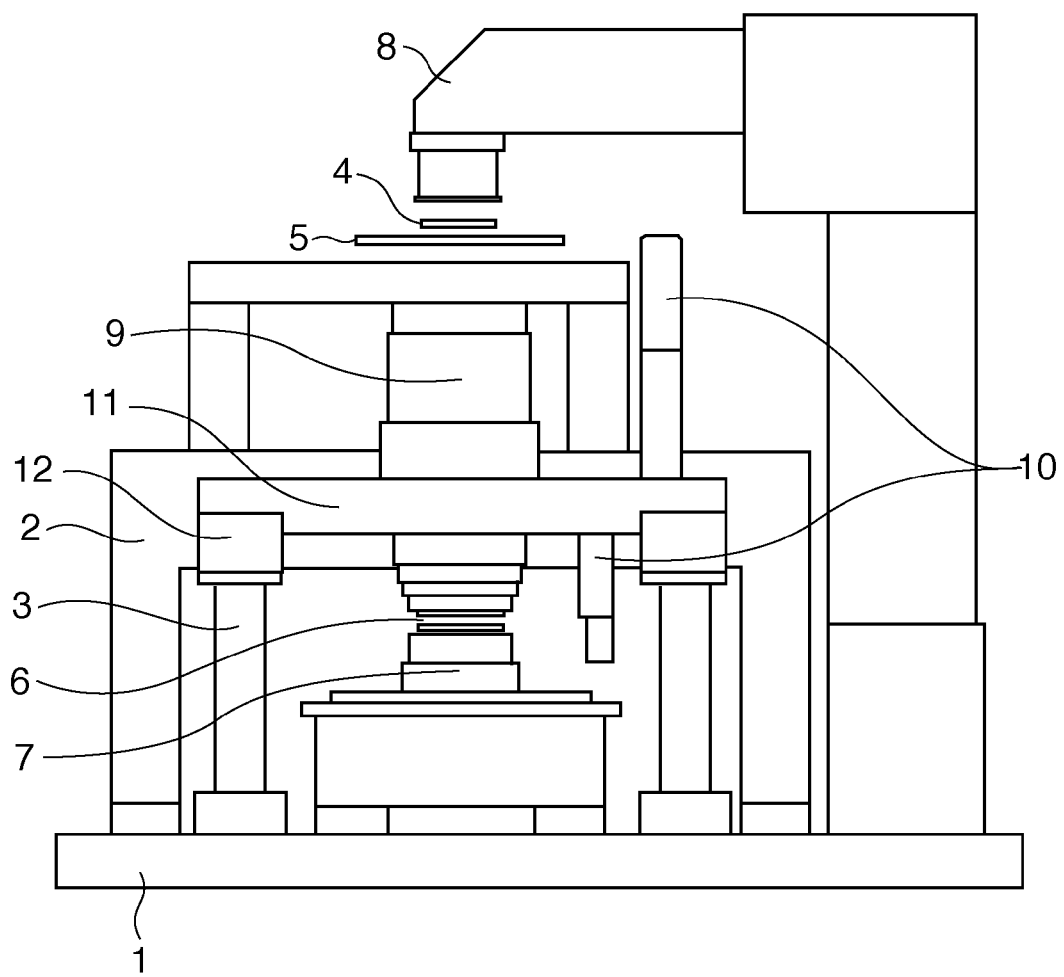
FIG. 1 is a schematic view of an embodiment of an exposure apparatus.

As shown in FIG. 1, an exposure apparatus of this embodiment comprises a base frame 2, an original stage 5, a stage mechanism 7 having a substrate stage, an illumination optical system 8, a projection optical system 9, a lens-barrel-support 11, and supporting legs 3.

The base frame 2 is a base structure which serves as the base of an exposure apparatus main body and supports at least one of the original stage 5 which supports an original 4, the illumination optical system 8 which illuminates the original 4 with exposure illumination light, and a conveyance device (not shown). The conveyance device conveys an original 4 or a substrate 6. The original stage 5 can move with the original 4 as an exposure target being placed on it, and the substrate stage can move with a substrate 6 (wafer or glass substrate) as an exposure target placed on it. The stage mechanism 7 also has a driving mechanism which drives the substrate stage, and a substrate stage surface plate. The projection optical system 9 projects the pattern of the original 4 onto the substrate 6 by reduction with a predetermined magnification (e.g., 4:1).

The lens-barrel-support 11 is a holding unit which holds the projection optical system 9 and a measurement system 10. Three active mounts 12 serving as anti-vibration mounts incorporate air springs, dampers, and actuators. The three active mounts 12 support the lens-barrel-support 11 such that high-frequency vibration from a floor 1 is not transmitted to the lens-barrel-support 11, and actively compensate for any tilt and swing of the lens-barrel-support 11. Although the number of active mounts 12 is three in this embodiment, four or more active mounts 12 can be installed. Three supporting legs 3 are supporting members that support the three active mounts 12 respectively.

The illumination optical system 8 incorporates a light source (a discharge lamp such as an ultra-high pressure mercury lamp) (not shown), or guides illumination light through a beam line from a light source (not shown) installed on the floor 1 separately of the exposure apparatus. The illumination optical system 8 generates slit light using various types of lenses and stops and slit-illuminates the original 4 held by the original stage 5 from above.

The base frame 2 and supporting legs 3 which are major characteristics of this embodiment will be described. The base frame 2 and supporting legs 3 are installed on the floor 1 of the clean room of a semiconductor manufacturing factory. The base frame 2 and supporting legs 3 are respectively fixed to the floor 1 at high rigidity by fastening anchor bolts or by adhesion, and can be regarded as substantially being integral with the floor 1 or as an extension of the floor 1.

Figure 3A:
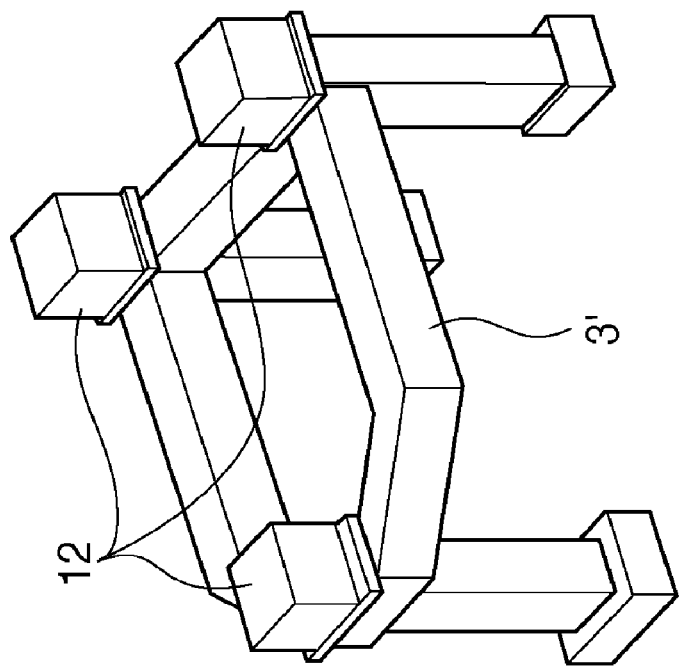
Figure 3A:
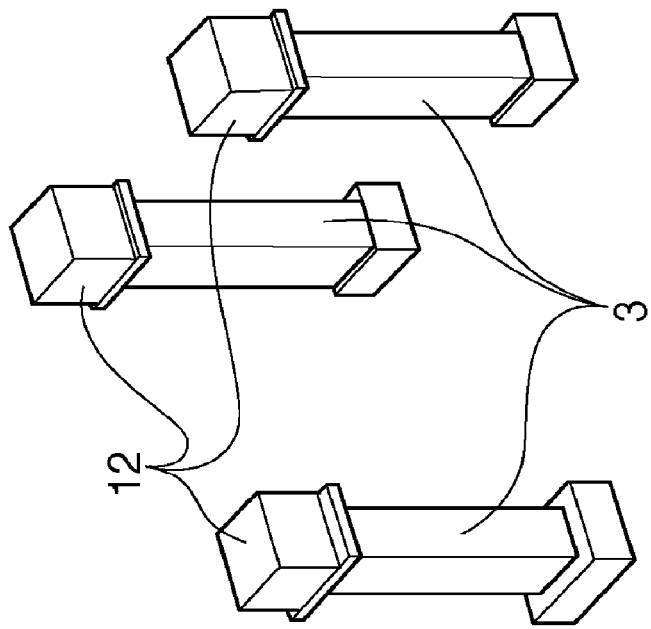
Figure 4:
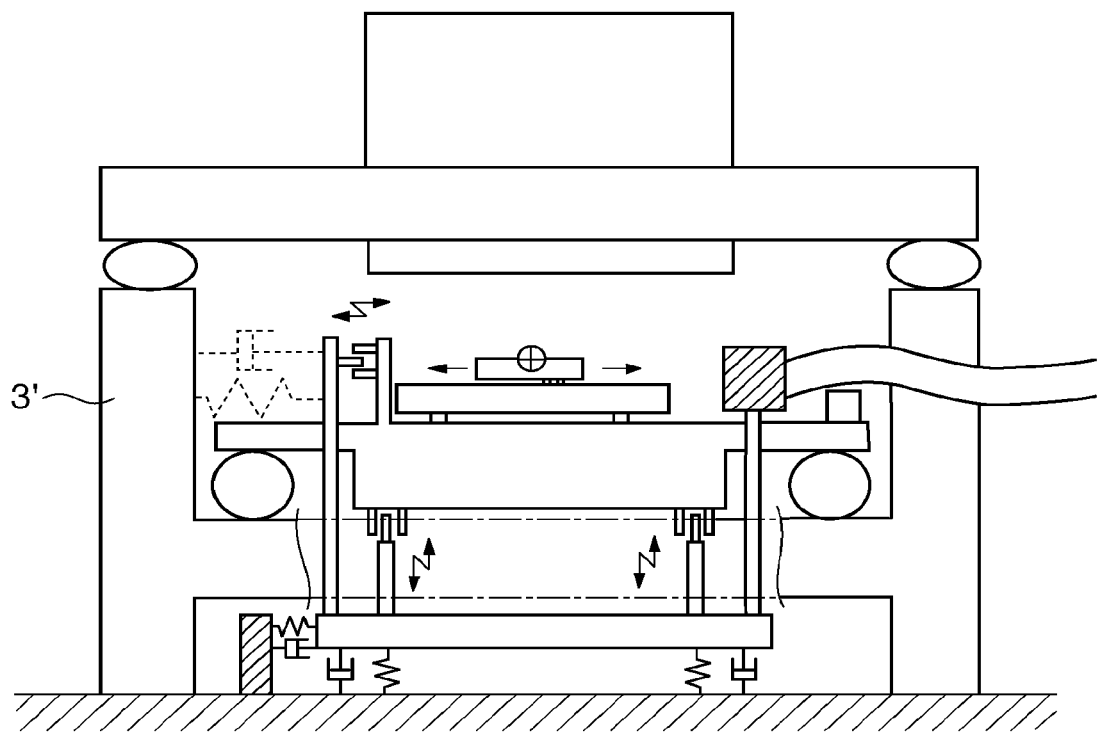
FIG. 4 is a schematic view of a conventional exposure apparatus.

The three or four supporting legs 3 support the lens-barrel-support 11 in the vertical direction through the (three or four) active mounts 12, and are installed on the floor 1 independently of each other without being connected to each other (see FIG. 3A). Consequently, a vibration mode of the connecting portion occurring in a structure (see FIG. 3B) in which the supporting legs 3 are connected to each other can be removed, so that the anti-vibration performance of the active mounts 12 with respect to floor vibration can be improved. Each independent supporting leg 3 can be regarded as a cantilever beam having a lower portion fixed to the floor 1 as a fixed end and an upper portion which supports the corresponding active mount 12 with a low natural frequency (e.g., 1 Hz to 3 Hz) as a free end. Hence, the natural frequency can be higher than that in a structure in which three or four supporting legs 3 are connected, so that the vibration of the floor 1 can be damped.

According to this embodiment, the substrate stage surface plate is installed on the floor 1 independently without being connected to the base frame 2 or supporting legs 3. Alternatively, the substrate stage surface plate can be supported by the base frame 2.

The supporting legs 3 are installed on the floor 1 independently without being connected to the base frame 2 and the stage mechanism 7 which has the substrate stage. Hence, even if a reaction force generated upon driving of the original stage 5, or the vibration of the floor excites the base frame 2, the vibration or swing of the base frame 2 does not interfere with the vibration or swing of the supporting legs 3. Furthermore, since the supporting legs 3 are not connected to the stage mechanism 7 having the substrate stage but are independent, the vibration or swing of the supporting legs 3 does not interfere with those of the substrate stage.

Figure 2:
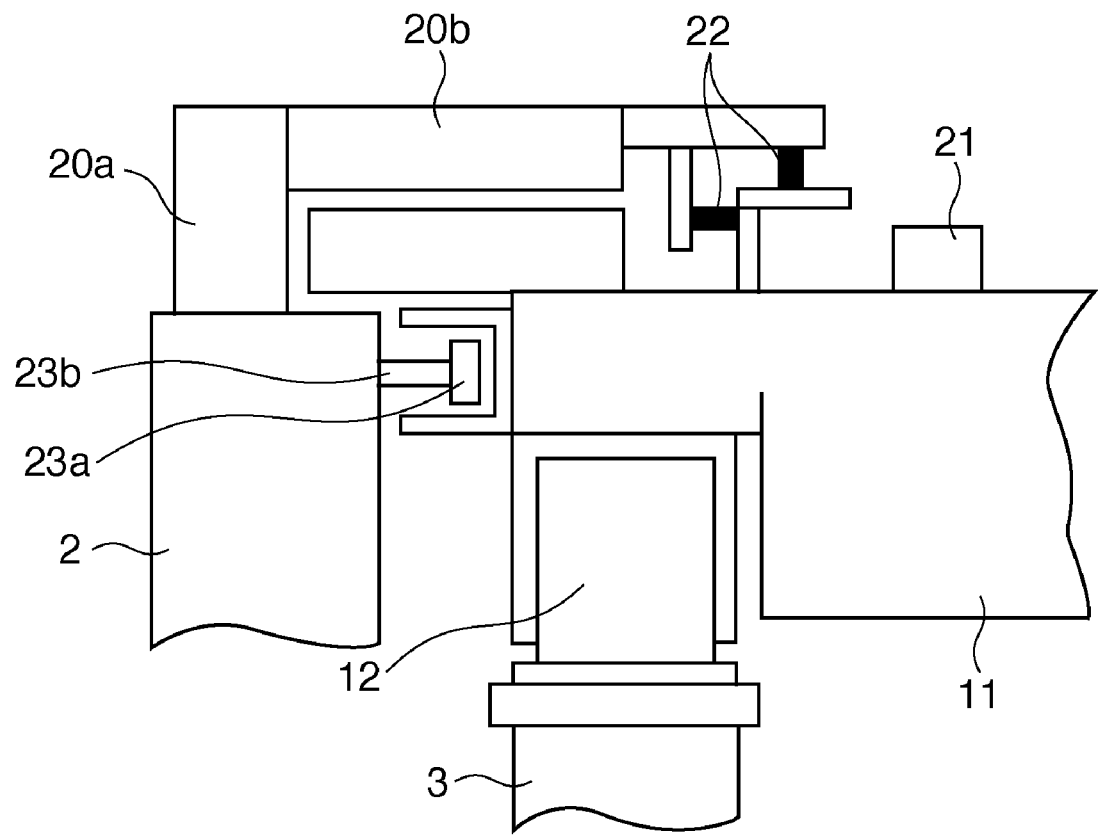
FIG. 2 is a view for explaining the periphery of an active mount.

The active mounts 12 and their peripheries will be described with reference to FIG. 2. The lens-barrel-support 11 which is shaken by vibration or the like caused by a disturbance should not cause interference between the units (e.g., the projection optical system 9 and original stage 5) of the exposure apparatus. For this purpose, a mechanical stopper 20 is necessary at the stroke ends in the horizontal and vertical directions of each active mount 12. In this embodiment, horizontal mechanical stoppers 20a and vertical mechanical stoppers 20b are placed on the base frame 2 and serve to receive the load of the lens-barrel-support 11. Accordingly, the supporting legs 3 need not to support a large load in the horizontal direction, so their shapes can be made compact.

An acceleration sensor 21 as a vibration sensor which senses vibration and a displacement sensor 22 as a position detector which detects the relative position of the lens-barrel-support 11 with respect to the base frame 2 are placed on the lens-barrel-support 11. A controller (not shown) controls at least one of the distances between the base frame 2 and lens-barrel-support 11 and the angle of inclination of the lens-barrel-support 11 based on outputs from the acceleration sensor 21 and displacement sensor 22. As the displacement sensor 22 which detects the relative positions of the base frame 2 and lens barrel-support-11, an eddy current displacement sensor, an electric capacitance displacement sensor, a displacement sensor which employs a photoelectric conversion element, or the like can be employed.

In order to decrease the vibration of the lens-barrel-support 11, a force actuator 23, which generates forces in the vertical and horizontal directions, is interposed between the lens-barrel-support 11 and base frame 2. Regarding the vertical direction, the force actuator 23 has three vertical force actuators 23a. Regarding the horizontal direction, the force actuator 23 has two horizontal force actuators 23b for each of a scanning exposure direction (Y direction) and a direction (X direction) perpendicular to it.

According to this embodiment, a linear motor which utilizes the Lorentz force is adopted as the force actuator. Alternatively, in place of the linear motor, an electromagnetic actuator which utilizes an electromagnetic force, a fluid actuator which utilizes fluid pressure such as air pressure or hydraulic pressure, a mechanical actuator which uses a piezoelectric element, or the like can be employed as the force actuator.

As shown in FIG. 1, the original stage 5 is supported by the base frame 2, and the stage mechanism 7 having the substrate stage is supported in the vertical direction with respect to the floor 1. The substrate stage, the illumination optical system 8, and the original conveyance device and substrate conveyance device (neither is shown) may be supported by either the base frame 2 or floor 1.

As has been described above, the supporting legs 3 which support the lens-barrel-support 11, on which the projection optical system 9 and measurement system 10 sensitive to the vibration are mounted, are not connected to each other but are independent of each other. Thus, the influence of floor vibration is decreased, that is, the anti-vibration performance improves. Furthermore, a unit that generates a reaction force accompanying the driving of the stage is mounted on the base frame 2, and the base frame 2 and supporting legs 3 are not connected to each other but are independent of each other. Thus, vibration transfer to the projection optical system 9 and measurement system 10 can be blocked.

A device (a semiconductor integrated circuit element, liquid crystal display element, or the like) is manufactured by an exposure step which exposes a substrate using the exposure apparatus of the embodiment described above, a developing step which develops the substrate exposed in the exposure step, and other known steps (etching, resist removal, dicing, boding, packaging, and the like) which process the substrate developed in the developing step.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-262730, filed Oct. 5, 2007 which is hereby incorporated by reference herein in its entirety.

What is claimed is:

1. An exposure apparatus configured to expose a pattern of an original on a substrate through a projection optical system, the apparatus comprising:
    a holding unit configured to hold the projection optical system;
    at least three anti-vibration mounts configured to support the holding unit;
    at least three supporting members configured to support the at least three anti-vibration mounts respectively;
    a base structure configured to support at least one of an original stage which holds the original, an illumination optical system which illuminates the original with exposure illumination light, a conveyance device which conveys the original, and a conveyance device which conveys the substrate;
    a position detector configured to detect a relative position of the holding unit with respect to the base structure; and
    a controller configured to control at least one of a distance between the base structure and the holding unit and an angle of tilt of the holding unit based on an output from the position detector,
    wherein the at least three supporting members are independent of each other without connecting to each other, and
    wherein the base structure are independent of the supporting members without connecting to the supporting members.

2. The apparatus according to claim 1, further comprising a stage mechanism including a substrate stage which holds the substrate, a driving mechanism which drives the substrate stage, and a substrate stage surface plate,
    wherein the substrate stage surface plate is supported by the base structure.

3. The apparatus according to claim 1, further comprising a stage mechanism including a substrate stage which holds the substrate, a driving mechanism which drives the substrate stage, and a substrate stage surface plate,
    wherein the substrate stage surface plate is independent of the base structure and the supporting members without connecting to the base structure and the supporting members.

4. An exposure apparatus configured to expose a pattern of an original on a substrate through a projection optical system, the apparatus comprising:
    a holding unit configured to hold the projection optical system;
    at least three anti-vibration mounts configured to support the holding unit;
    at least three supporting members configured to support the at least three anti-vibration mounts respectively;
    a base structure configured to support at least one of an original stage which holds the original, an illumination optical system which illuminates the original with exposure illumination light, a conveyance device which conveys the original, and a conveyance device which conveys the substrate;
    a vibration sensor configured to sense vibration of the holding unit; and
    a force actuator configured to generate a force decreasing the vibration of the holding unit between the base structure and the holding unit based on an output from the vibration sensor,
    wherein the at least three supporting members are independent of each other without connecting to each other, and
    wherein the base structure are independent of the supporting members without connecting to the supporting members.

5. A method of manufacturing a device, the method comprising:
    exposing a substrate using an exposure apparatus;
    developing the exposed substrate; and
    processing the developed substrate to manufacture the device,
    wherein the exposure apparatus comprises:
    a projection optical system;
    a holding unit configured to hold the projection optical system;
    at least three anti-vibration mounts configured to support the holding unit; and
    at least three supporting members configured to support the at least three anti-vibration mounts respectively;
    a base structure configured to support at least one of an original stage which holds the original, an illumination optical system which illuminates the original with exposure illumination light, a conveyance device which conveys the original, and a conveyance device which conveys the substrate;
    a position detector configured to detect a relative position of the holding unit with respect to the base structure; and
    a controller configured to control at least one of a distance between the base structure and the holding unit and an angle of tilt of the holding unit based on an output from the position detector,
    the at least three supporting members being independent of each other without connecting to each other,
    the base structure being independent of the supporting members without connecting to the supporting members.

6. A method of manufacturing a device, the method comprising:
    exposing a substrate using an exposure apparatus;
    developing the exposed substrate; and
    processing the developed substrate to manufacture the device,
    wherein the exposure apparatus comprises:
    a projection optical system;
    a holding unit configured to hold the projection optical system;
    at least three anti-vibration mounts configured to support the holding unit;

at least three supporting members configured to support the at least three anti-vibration mounts respectively;

a base structure configured to support at least one of an original stage which holds the original, an illumination optical system which illuminates the original with exposure illumination light, a conveyance device which conveys the original, and a conveyance device which conveys the substrate;

a vibration sensor configured to sense vibration of the holding unit; and a force actuator configured to generate a force decreasing the vibration of the holding unit between the base structure and the holding unit based on an output from the vibration sensor, the at least three supporting members being independent of each other without connecting to each other, the base structure being independent of the supporting members without connecting to the supporting members.

7. The apparatus according to claim 4, further comprising a stage mechanism including a substrate stage which holds the substrate, a driving mechanism which drives the substrate stage, and a substrate stage surface plate, wherein the substrate stage surface plate is supported by the base structure.

8. The apparatus according to claim 4, further comprising a stage mechanism including a substrate stage which holds the substrate, a driving mechanism which drives the substrate stage, and a substrate stage surface plate, wherein the substrate stage surface plate is independent of the base structure and the supporting members without connecting to the base structure and the supporting members.

9. The method according to claim 5, wherein the exposure apparatus further comprises a stage mechanism including a substrate stage which holds the substrate, a driving mechanism which drives the substrate stage, and a substrate stage surface plate, wherein the substrate stage surface plate is supported by the base structure.

10. The method according to claim 5, wherein the exposure apparatus further comprises a stage mechanism including a substrate stage which holds the substrate, a driving mechanism which drives the substrate stage, and a substrate stage surface plate, wherein the substrate stage surface plate is independent of the base structure and the supporting members without connecting to the base structure and the supporting members.

11. The method according to claim 6, wherein the exposure apparatus further comprises a stage mechanism including a substrate stage which holds the substrate, a driving mechanism which drives the substrate stage, and a substrate stage surface plate, wherein the substrate stage surface plate is supported by the base structure.

12. The method according to claim 6, wherein the exposure apparatus further comprises a stage mechanism including a substrate stage which holds the substrate, a driving mechanism which drives the substrate stage, and a substrate stage surface plate, wherein the substrate stage surface plate is independent of the base structure and the supporting members without connecting to the base structure and the supporting members.

* * * * *